(12) United States Patent
Kin et al.

(10) Patent No.: US 7,202,175 B2
(45) Date of Patent: Apr. 10, 2007

(54) METHOD AND APPARATUS FOR TREATING A SUBSTRATE SURFACE BY BUBBLING

(75) Inventors: Kon-Tsu Kin, Hsinchu (TW);
Chiou-Mei Chen, Hsinchu (TW);
Jen-Chung Lou, Hsinchu (TW);
Ching-Yi Hsu, Hsinchu (TW);
Farhang Shadman, Tucson, AZ (US)

(73) Assignee: Industrial Technology Research Institute, Hsinchu (TW)

( * ) Notice: Subject to any disclaimer, the term of this patent is extended or adjusted under 35 U.S.C. 154(b) by 193 days.

(21) Appl. No.: 10/702,442

(22) Filed: Nov. 7, 2003

(65) Prior Publication Data

US 2005/0101144 A1    May 12, 2005

(51) Int. Cl.
*H01L 21/302* (2006.01)

(52) U.S. Cl. .............. 438/704; 438/745; 430/329; 134/1.3

(58) Field of Classification Search ............ 438/704, 438/745; 430/329; 134/1.3, 2, 3
See application file for complete search history.

(56) References Cited

U.S. PATENT DOCUMENTS

| | | | | |
|---|---|---|---|---|
| 5,378,317 A | * | 1/1995 | Kashiwase et al. ......... | 438/704 |
| 6,517,998 B1 | * | 2/2003 | Noda et al. .................. | 430/329 |
| 6,558,477 B1 | * | 5/2003 | Scovell ........................ | 134/30 |
| 6,622,738 B2 | * | 9/2003 | Scovell ........................ | 134/61 |
| 6,696,228 B2 | * | 2/2004 | Muraoka et al. ............ | 430/329 |
| 2002/0011257 A1 | * | 1/2002 | Degendt et al. ............... | 134/3 |

* cited by examiner

*Primary Examiner*—Kin-Chan Chen
(74) *Attorney, Agent, or Firm*—Bacon & Thomas, PLLC

(57) ABSTRACT

The present invention discloses a technique of removing a substance from a substrate surface, such as stripping photoresist from a wafer, or forming a substance on a substrate surface. Substrates to be treated are parallel arranged at an equal interval and are immersed in a liquid with only a lower portion thereof being below the liquid surface. Gas such as ozone is introduced into the liquid and is continuously bubbling below the substrates. The bubbles will ascend between two adjacent substrates and climb on the surfaces of the substrates before they burst. The liquid boundary layers on the substrate surfaces are compressed and refreshed in the course of a dragging ascent of the bubbles, enhancing mass transfer between gas/liquid/solid substances across the liquid boundary layer, thereby resulting in a fast reaction and a fast treatment of the surface of the substrates.

3 Claims, 3 Drawing Sheets

METHOD AND APPARATUS FOR TREATING A SUBSTRATE SURFACE BY BUBBLING

FIELD OF THE INVENTION

The present invention relates generally to a technique of treating a substrate surface by bubbling, and more particularly to a technique of stripping photoresist from a substrate surface by bubbling.

BACKGROUND OF THE INVENTION

The heterogeneous reaction system is an indispensable part of various industrial processes, such as catalytic reaction system, and film growing processes of the high-level electronic elements. The emphasis of research relevant to the industrial processes is placed on the enhancement of heterogeneous mass transfer efficiency in multiphase of the heterogeneous reaction system. In a gas-liquid-solid coexistant heterogeneous reaction system, the reaction must be brought about through boundary layers of the gas-liquid phase and the liquid-solid phase. As a result, the thickness and the refreshment frequency of the boundary layer become the bottlenecks in reaction rate. The conventional method of enhancing the interfacial mass transfer efficiency makes use of mechanical agitation, supersonic or ultrasonic oscillation to compress the thickness of the boundary layer. The mechanical agitation is ineffective in compressing the boundary layer at the gas-liquid interface and is therefore limited in effect to enhance the mass transfer. A relatively new approach makes use of the centrifugal force of high speed rotation to bring about a centrifugal removal of water layer from a solid surface so as to compress the thickness of water film and to refresh the contact interface. This new approach is energy-consuming and is likely to produce a particle contamination which is resulted from a protracted high-speed operation. In addition, this new approach is limited in applicability in that a substance to be treated by the approach must have a specific shape and dimension.

U.S. Pat. Nos. 6,627,125 and 6,273,108 disclose respectively a method making use of ozone and liquid to treat the surface of a semiconductor substrate. The liquid is heated and then sprayed on the surface of the semiconductor substrate. The substrate is turned at a high speed so as to control the thickness of the boundary layer of the treatment liquid on the substrate surface. Meanwhile, the ozone is introduced under the circumstances that the substrate temperature and the boundary layer thickness are maintained. As a result, the barrier, which prevents permeation of the ozone through the boundary layer, is effectively alleviated. The techniques disclosed in these U.S. patents and relevant to the present invention are incorporated into this specification in the form of reference.

U.S. Pat. No. 6,551,409 discloses a method for removing organic contaminants from a semiconductor surface, wherein the semiconductor is held in a tank and the tank is filled with a fluid such as a liquid or a gas. Organic contaminants, such as photoresist, photoresidue, and dry etched residue, occur in process steps of semiconductor fabrication and at times, require removal. The organic contaminants are removed from the semiconductor surface by holding the semiconductor inside a tank. The method is practiced using gas phase processing. The tank is filled with a gas mixture, comprising water vapor and ozone.

U.S. Pat. No. 6,558,477 B1 discloses a method for removing photoresist or other organic material from a substrate such as a semiconductor wafer. The method includes partially immersing the substrate in a solvent (e.g., deionized water) in a reaction chamber, injecting an oxidizing gas (e.g., ozone) into the reaction chamber, and rotating or otherwise moving the substrate through the solvent to coat a thin film of solvent over the organic component on the substrate surface and expose the solvent-coated substrate to the ozone gas to remove the organic material from the surface.

SUMMARY OF THE INVENTION

The control techniques of boundary layer compression and reaction interface refreshment frequency are critical factors determining the efficiency of a heterogeneous mass transfer. The present invention discloses a controlling means to compress the thickness of a heterogeneous reaction system boundary layer. The controlling means of the present invention involves the use of gas bubbles which are naturally formed in a liquid by a gas. As the gas bubbles come in contact with a substrate surface, the gas bubbles located at the upper portion of the substrate surface are pushed to rise by the gas bubbles located at the lower portion of the substrate surface. In the course of such a dragging ascent of the gas bubbles, the boundary layer is compressed and made thinner, thereby resulting in a continuous refreshment of the reaction interface so as to allow a rapid passage of molecules of a reactive gas through an ultrathin liquid film to effect a reaction on the substrate surface. Meanwhile, the reaction product is carried away by means of reverse diffusion. It is therefore readily apparent that the controlling means of the present invention optimizes the efficiency of an boundary layer mass transfer. In addition, the controlling means of the present invention is cost-effective in terms of water consumption and energy consumption. Moreover, the controlling means of the present invention does not bring about a particle pollution and is adapted to treat the materials of various dimensions. The technique of the present invention is applicable to the stripping of lithography photoresist and the rinsing of a substrate surface in the manufacturing process of a semiconductor, TFT-LCD, micro/nano precision molding tool, etc. The technique of the present invention has a great deal of application potential in the fields of medical equipment sterilization and manufacture of nanomaterials.

The features and the advantages of the present invention will be more readily understood upon a thoughtful deliberation of the following detailed description of the preferred embodiments and a comparative experiment with reference to the accompanying drawings.

DETAILED DESCRIPTION OF THE PREFERRED EMBODIMENTS

The present invention discloses a method of treating a surface of a substrate, said method comprising the following steps:

(a) forming bubbles with a liquid and a gas on the surface of the substrate; and (b) allowing the gas bubbles to ascend along the surface of the substrate such that the gas bubbles work to strip a substance from the surface of the substrate, or that the gas bubbles work to form a substance on the surface of the substrate.

Preferably, the gas bubbles work to strip a substance from the surface of the substrate in the step (b). More preferably, the substrate is a wafer, and the substance to be removed is a photoresist or an organic contaminant is on the surface of the wafer.

Preferably, the substrate is immersed in the liquid contained in a bath such that only a bottom portion of the substrate is immersed in the liquid, and the gas is introduced to the bath to form the bubbles. More preferably, the substrate is vertically immersed in the liquid contained in the bath, and the substrate is driven to turn in the bath, thereby enabling outer edges of the substrate to be immersed in the liquid in rotation.

Preferably, a plurality of the substrates are equidistantly arranged and are parallel to one another, whereby the substrates are simultaneously treated.

Preferably, the liquid used in the method of the present invention is pure water, ozone water, or aqueous solution containing chemical substance; wherein the gas is a gas mixture containing ozone, a gas mixture containing a reactive gas, or air. More preferably, the liquid is pure water or ozone water.

The present invention also discloses an apparatus for use in treating a surface of a substrate, said apparatus comprising:

a liquid tank in which a liquid is kept such that a liquid level is formed;

a substrate holding cassette disposed in the liquid tank in such a way that only a bottom portion of a substrate held in the cassette is immersed in the liquid; and an aeration mechanism disposed beneath the liquid level for producing bubbles in the liquid.

Preferably, the apparatus of the present invention further comprising a rotating mechanism for causing the substrate holding cassette to turn in the liquid tank around a horizontal axis.

Preferably, the aeration mechanism comprises a gas tube disposed in the liquid tank, and the gas tube is provided at one end with one or more openings. More preferably, the gas tube is located beneath the substrate holding cassette.

Preferably, the substrate holding cassette is provided with a plurality of slit pairs, each for holding one substrate, thereby enabling the substrate holding cassette to hold a plurality of substrates in such a manner that the substrates are parallel to one another, and that the substrates are perpendicular to the liquid level.

Figure 1:
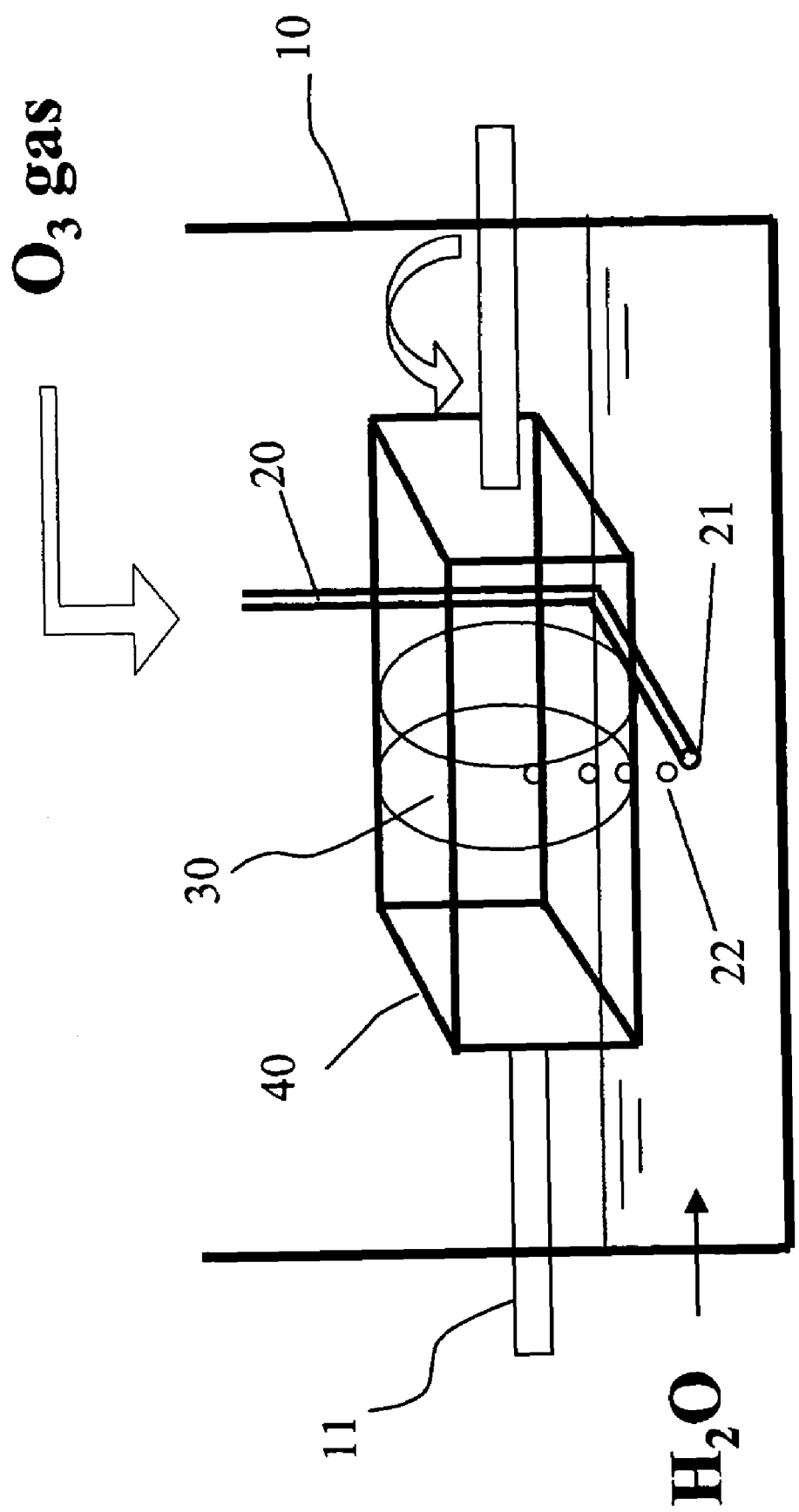
FIG. 1 shows a schematic view of an apparatus which is used in the present invention to treat a substrate surface.

As shown in FIG. 1, an apparatus is used in the first preferred embodiment of the present invention for stripping the photoresist from a wafer surface in conjunction with an $O_3/H_2O$ reaction system. A gas-liquid reaction tank 10 contains a predetermined amount of ultrapure water and is provided with a gas tube 20 which is mounted at one end in the bottom of the reaction tank 10. The one end of the gas tube 20 is provided with an opening 21 having a diameter in the range of 0.05–3.00 mm. The gas tube 20 is connected at the other end to an ozone supply source (not shown in the drawing). A pressurized gas mixture containing ozone is introduced from the ozone supply source into the reaction tank 10 via the opening 21 of the gas tube 20, thereby resulting in formation of gas bubbles 22 in the reaction tank 10.

A wafer holding cassette 40 is used to hold two wafers 30 which are coated on a surface with photoresist. The two wafers 30 are held in the cassette 40 in such a manner that the coated surfaces of the two wafers 30 are opposite and parallel to each other. The cassette 40 containing the wafers 30 is fixed in the reaction tank 10 by means of two rotary shafts 11 such that the two wafers 30 are vertically immersed in the ultrapure water, and that only the bottoms of the two wafers 30 are immersed in the ultrapure water, and further that the space separating the two wafers 30 is located right above the opening 21 of the gas tube 20, with the gas tube 20 being separated from the bottom edges of the wafers 30 by a distance ranging from 1 to 3 cm.

It must be noted here that more than two wafers 30 may be simultaneously treated in the reaction tank 10 by increasing correspondingly the number of the gas tube 20, or the number of the opening 21 of the gas tube 20 which should be re-arranged along the longitudinal direction of the shaft 11.

The stripping of the photoresist from the surface of the wafers 30 is effected by the gas bubbles 22 which ascend from the bottom portion to the upper portion of the coated surface of the wafers 30. In the course of such a dragging ascent of the gas bubbles 22 along the coated surface of the wafers 30, the photoresist is stripped from the surface of the wafers 30. In the course of the gas bubbles 22 ascending to arrive the upper portion of the wafers 30, the gas bubbles 22 burst. The wafer holding cassette 40 can be turned continuously or intermittently by the rotary shafts 11, so as to enable the photoresist to be stripped from the surface of the wafers 30 in a uniform manner.

Figure 2:
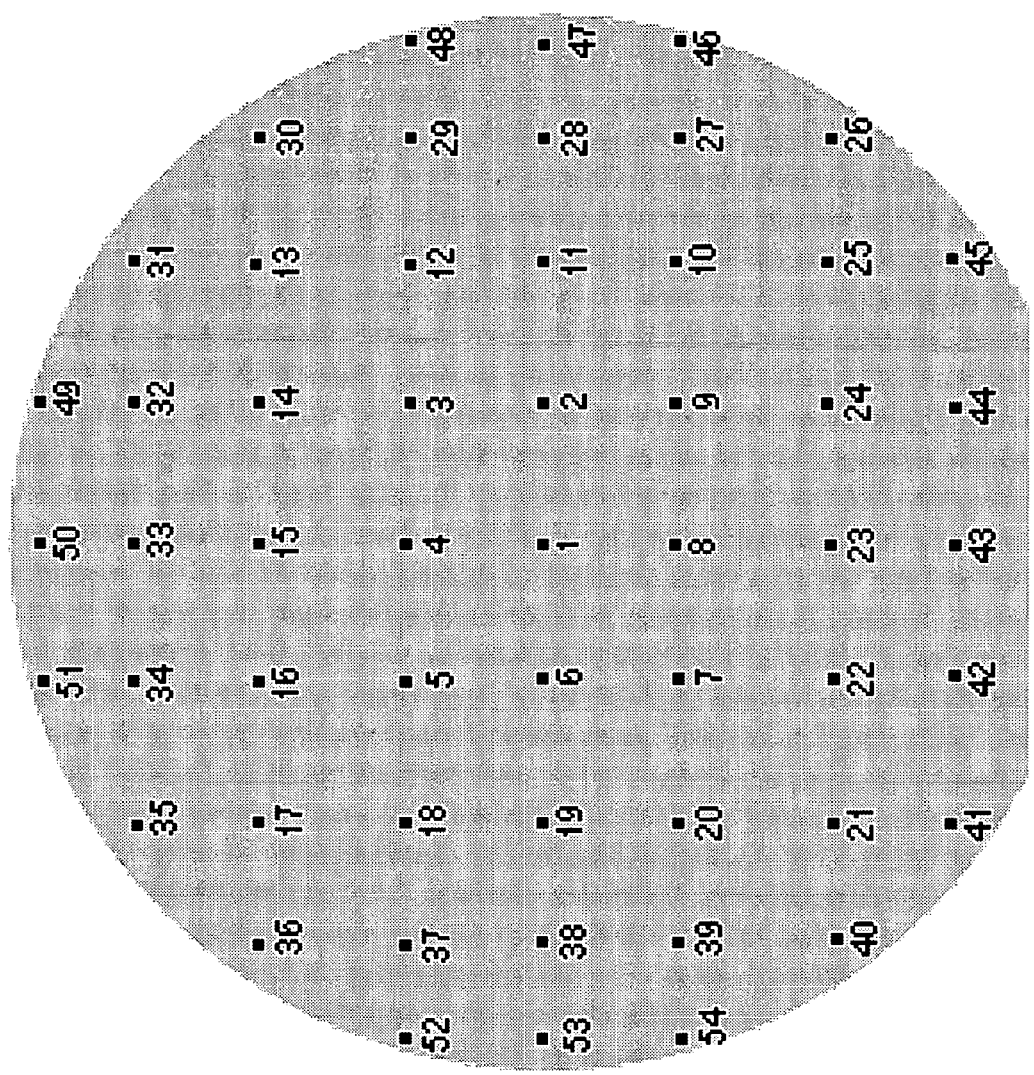
FIG. 2 shows a schematic view of 54 measurement points distribution on a wafer of the present invention.

The first preferred embodiment of the present invention comprises two wafers which were coated with a photoresist having a thickness of 10000 Å or so. The stripping process took place in the apparatus as shown in FIG. 1. However, prior to the stripping process, the measurement of the photoresist thickness was taken on 54 points of the wafer by means of an OLYMUS nanospec. The distribution of these 54 points is shown in FIG. 2.

The stripping process was carried out in such a way that about one third (2.8 cm) of the wafers (the lower portion) was immersed in the ultrapure water whose temperature was kept at 50 degrees in Celsius. The gas tube 20 was provided at one end with an opening having a hole diameter of 0.1 mm. The gas tube 20 was connected at the other end to an ozone generator made by the Anseros Company of Germany. The ozone flow rate was 90 NL/hr, with the ozone concentration being 17% (w/w). The wafer holding cassette 40 was turned by the rotary shafts 11 which were revolved at 3–4 rpm. The stripping process lasted for two minutes. Thereafter the wafers were rinsed with the deionized water before they were blow-dried with a nitrogen gun. Finally, the photoresist thickness of 54 points of the wafers were measured with the OLYMPUS nanospec.

Figure 3:
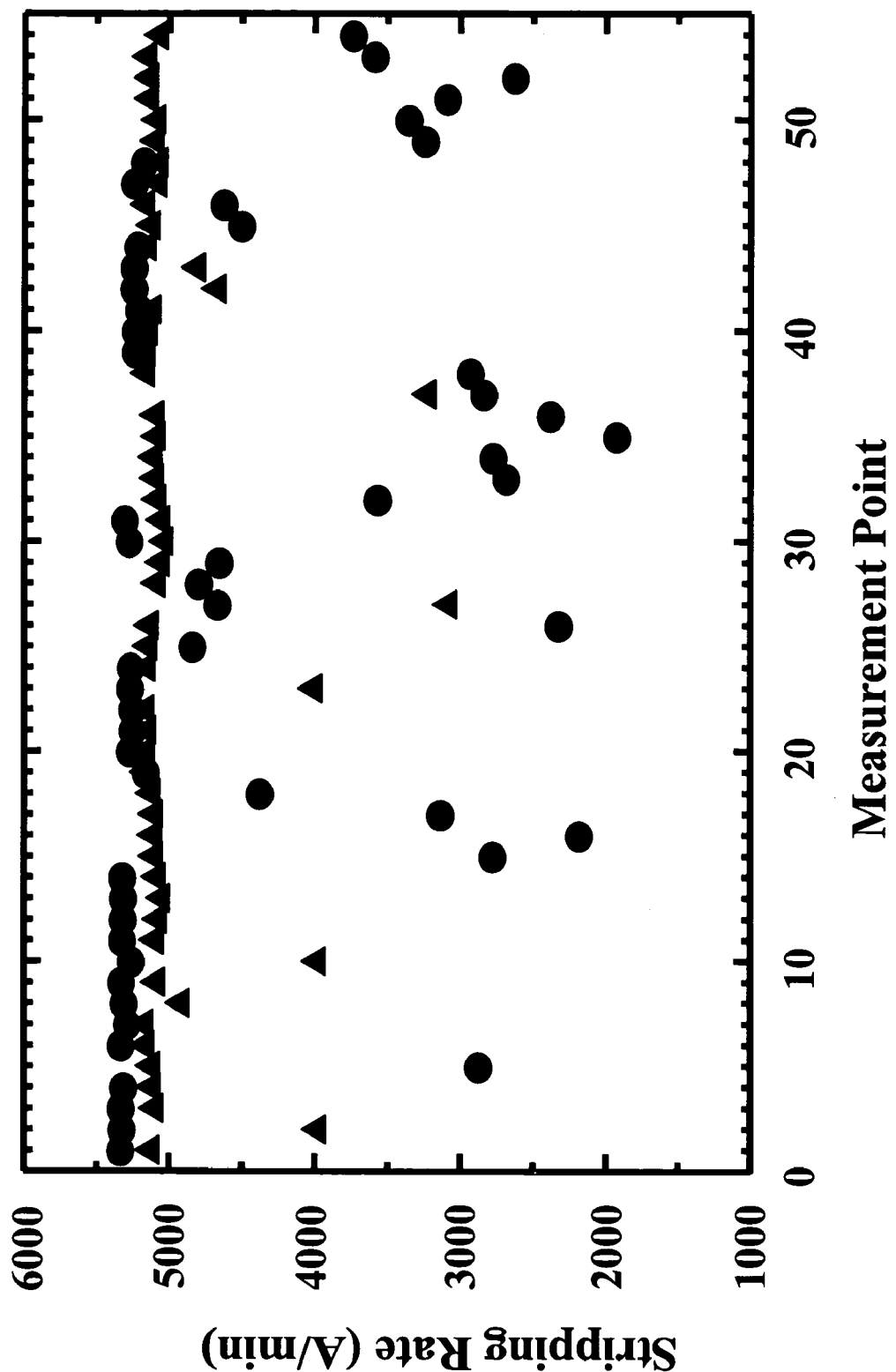
FIG. 3 shows a comparative diagram of photoresist stripping rates of the 54 measurement points shown in FIG. 2 in a first preferred embodiment of the present invention denoted by black circles, and the comparative experiment denoted by black triangles.

A comparative experiment was carried out with reference to the first preferred embodiment of the present invention. The comparative experiment involved the use of a conventional SPM method (sulfuric acid:hydrogen peroxide=3:1 in water at 120° C.) to strip photoresist from the surface of the wafers. In the comparative experiment and the first preferred embodiment of the present invention, the wafers were coated with the photoresist in an identical manner. In addition, the thickness of the photoresist of the wafers of both cases were measured identically with the same device. The SPM stripping process was carried out at 120° C. for two minutes. The comparative results are shown in FIG. 3.

The conventional SPM method must be carried out at a relatively high temperature which is translated into a high energy cost. In addition, the conventional SPM method makes use of a large amount of the deionized water by which the sulfuric acid is washed away from the surface of a treated wafer. It is therefore readily apparent that the conventional SPM method is not cost-effective. Moreover, sulfuric acid is corrosive to metal and can not be therefore used to treat a substrate containing metal.

A second preferred embodiment of the present invention was basically similar to the first preferred embodiment of the present invention, except that the former made use of an ultrapure water having room temperature.

A third preferred embodiment of the present invention was also basically similar to the first preferred embodiment of the present invention, with the difference being that the former used an ultrapure water having temperature of 80° C.

The average stripping rates of the first, the second, and the third preferred embodiment of the present invention are contained in the following table.

|  | Embodiment | | |
| --- | --- | --- | --- |
|  | 1 (50° C.) | 2 (room temperature) | 3 (80° C.) |
| Average stripping rate (Å/min) | 2813 | 2630 | 2409 |

The embodiments of the present invention described above are illustrative and nonrestrictive. Accordingly, the present invention may be embodied in other specific forms without deviating from the spirit thereof. The present invention is therefore to be limited only by the scopes of the following claims.

What is claimed is:

1. A method of treating a surface of a substrate, said method comprising the following steps of:
   (a) forming bubbles with a liquid and a gas on the surface of the substrate comprising immersing a plurality of the substrates which are equidistantly arranged and are parallel to one another in the liquid contained in a bath such that only bottom portions of the substrates are immersed in the liquid, and the gas is introduced to the bath to form the bubbles; and
   (b) allowing the gas bubbles to ascend along the surface of the substrate, including the surface above the horizon of the liquid, such that the gas bubbles work to strip a substance from the surface of the substrate;
   wherein the liquid comprises ozone water, the gas comprises a gas mixture comprising ozone, and the substance comprises a photoresist.

2. The method as defined in claim 1, wherein the substrate is a wafer.

3. The method as defined in claim 1, wherein the substrate is vertically immersed in the liquid contained in the bath, and the substrate is driven to turn in the bath, thereby enabling outer edges of the substrate to be immersed in the liquid in rotation.

* * * * *